United States Patent [19]

Lu

[11] Patent Number: 5,434,973
[45] Date of Patent: Jul. 18, 1995

[54] MICROCONTROLLER FOR PROVIDING REMOTE CONTROL OF ELECTRICAL SWITCHES

[76] Inventor: Chao-Cheng Lu, No. 4-4, Alley 27, Lane 143 Chun Kung Road, Taipei, Taiwan, 11614

[21] Appl. No.: 860,169

[22] Filed: Mar. 17, 1992

[51] Int. Cl.⁶ .................................... G06F 13/00
[52] U.S. Cl. .............................. 395/200; 364/221.9; 364/919.4; 364/919.5; 364/DIG. 2; 379/102; 379/104
[58] Field of Search .............. 395/200, 275; 379/102, 379/105, 104; 364/221.9, 919.4, 919.5

[56] References Cited

U.S. PATENT DOCUMENTS

| | | | |
|---|---|---|---|
| 4,442,319 | 4/1984 | Treidl | 379/105 |
| 4,845,773 | 7/1989 | Attallah | 379/102 |
| 5,127,045 | 6/1992 | Cragun et al. | 379/88 |

Primary Examiner—Thomas C. Lee
Assistant Examiner—Moustafa M. Meky
Attorney, Agent, or Firm—Jacobson, Price, Holman & Stern

[57] ABSTRACT

A microcontroller for providing remote control of electrical switches and comprising a control unit and a switch unit. The control unit comprises a telephone interface, a keyboard, a central processing unit and a character pattern interface. The switch unit comprises a data decoder, a central processing unit and a plurality of solid state relays, wherein the solid state relays are controlled to selectively connect power to loads or disconnect power therefrom, in response to commands sent from the keyboard directly, or through a telephone or radio telephone or a computer network from the keyboard.

10 Claims, 3 Drawing Sheets

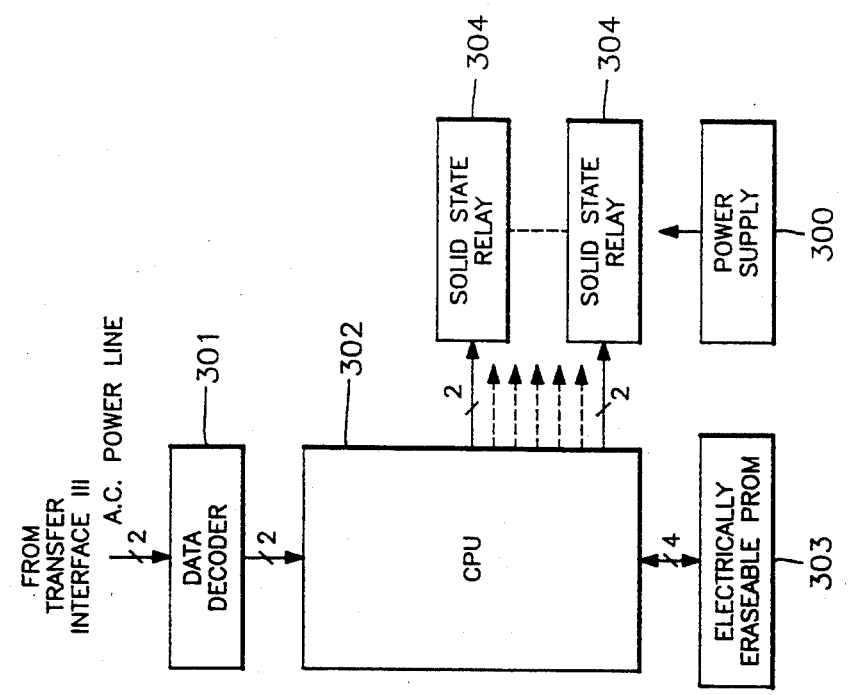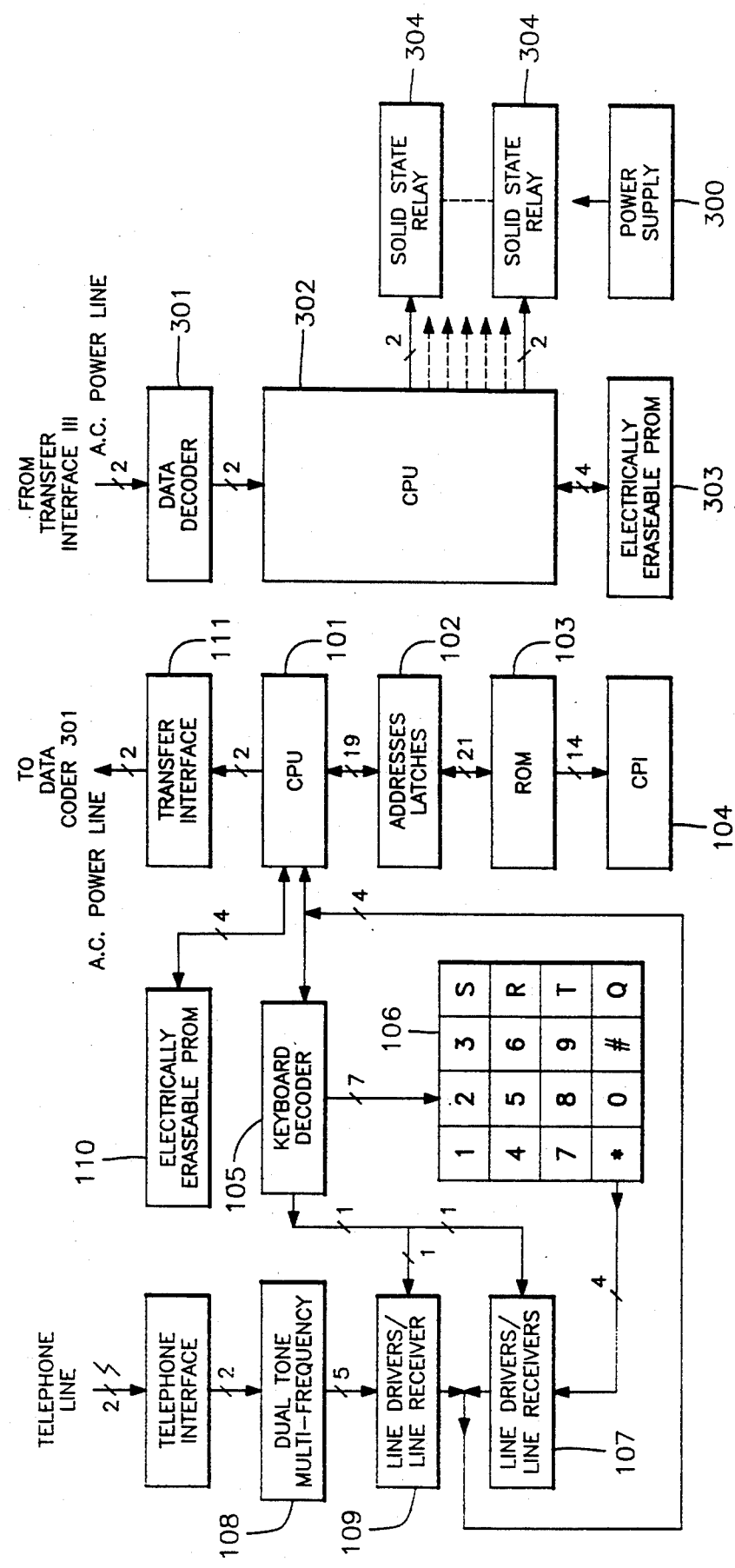

MICROCONTROLLER FOR PROVIDING REMOTE CONTROL OF ELECTRICAL SWITCHES

BACKGROUND OF THE INVENTION

The present invention relates to microcontrollers, and more particularly, the present invention relates to a microcontroller used in controlling switches by means of the operation of a software program controlled keyboard and central processing units.

Conventionally, an On/Off switch used in controlling an electric appliance is operated manually. Therefore, a conventional On/Off switch can't be controlled remotely through a telephone. Further, when several On/Off switches and several loads are to be connected to a common electric socket, more electric wires are to be used, and more labor is required.

SUMMARY OF THE INVENTION

The present invention has been accomplished under the aforesaid circumstances. It is therefore an object of the present invention to provide a microcontroller which permits a switch or switches to be controlled through a telephone, a mobile telephone, or a computer network. It is another object of the present invention to provide a microcontroller for controlling electrical switches, which greatly reduces electrical wiring materials and labor cost.

According to the present invention, a microcontroller is generally comprised of a switch unit controlled by a control unit. The control unit comprises a central processing unit (CPU), an address latch, a read only memory, a character pattern interface, a keyboard decoder, a keyboard, line drivers/line receivers, dual tone multifrequency (DTMF) unit, an electrically erasable programmable read only memory (EEPROM), and a transmitter interface. The switch unit comprises a power source, a data decoder, a central processing unit (CPU), an electrically erasable programmable read only memory (EEPROM), and a plurality of solid state relays. Transmit codes, function codes, switch codes and execution codes are given through the keyboard and sent through the transmitter interface to the central processing unit of the switch unit via its data decoder, to control designated solid state relays, and in response, the loads at the designated solid state relays are controlled. By means of the telephone interface, instructions can be sent to the control unit through a standard telephone or a mobile telephone, or through a computer network.

BRIEF DESCRIPTION OF THE DRAWINGS

FIG. 1 is a block diagram of the control unit and the switch unit of the preferred embodiment of the present invention;

DETAILED DESCRIPTION OF THE PREFERRED EMBODIMENT

Figure 2:
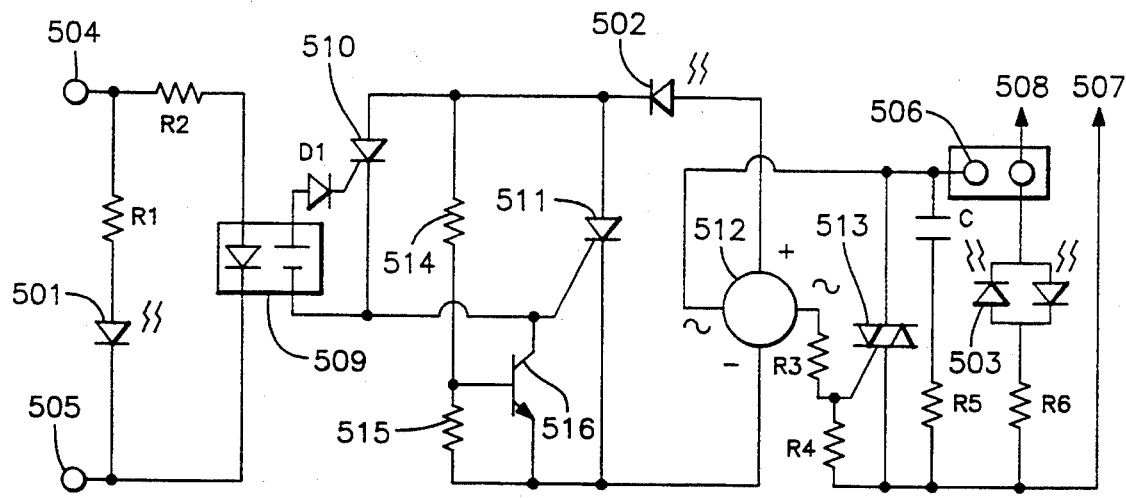
FIG. 2 is a circuit diagram of a solid state relay according to the present invention.

Referring to FIG. 1, the present invention is generally comprised of a control unit A which comprises a central processing unit (CPU) 101, an address latch 102, a read only memory (ROM) 103, a character pattern interface (CPI) 104, a keyboard decoder 105, a keyboard 106, a first line driver/line receiver 107, a dual tone multifrequency (DTMF) unit 108, a second line driver/line receiver 109, an electrically erasable programmable read only memory (EEPROM) 110, and a transmitter interface 111; and a switch unit a which comprises of a power supply 300, a data decoder 30], a central processing unit (CPU) 302, an electrically erasable programmable read only memory (EEPROM) 303, and a plurality of solid state relays 304.

The CPU 101 is a micro controller which controls the operation of all the interfaces of the control unit A and a counter therein. The oscillating frequency of the CPU 101 is determined according to the desired application. The address latch 102 is an interface for coupling the the CPU 101 and the ROM 103. The ROM 103 provides a means for storing the programs to be used. The nature and capacity of the ROM 103 is determined according to the function of the control unit A and the number of switches in the switch unit B. The character pattern interface 104 comprises a character pattern board and is used in displaying a transmit code, function code and switch code from the CPU 101. The keyboard decoder 105 decodes the data from the keyboard. The keyboard 106 achieves data input using a process of multiplex scanning. Scanned data from the keyboard 106 is decoded by the keyboard decoder 105 and is then sent through the first line driver/line receiver 107 to the CPU 101. The data will further be transmitted from the CPU 101 of the control unit A to the CPU 302 of the switch unit B via the transmitter interface 111 and the data decoder 301. When a ringer data is produced through the telephone interface of a telephone, the ringer data immediately causes the CPU 101 to stop its operation. One to five seconds after ringing, the telephone is automatically connected, and the ringer data is sent to the DTMF unit 108 for decoding. After decoding, the data is sent through the second line driver/line receiver 109 to the CPU 101, and is then transmitted to the CPU 302 of the switch unit B via the transmitter interface 111 and the data decoder 301. The EEPROM 110 is directly coupled to the CPU 101 to prevent registered data from being erased during a power failure. The transmitter interface 111 is a high frequency transmitter for transmitting output data from the CPU 101 to the switch unit B through a distribution line for an AC power source. Output data from the CPU 101 includes a transmit code for recognition by the switch unit B, function code for controlling an On/Off status of the switch unit B and its other specific functions, and switch code to give each switch of a plurality of switches connected to the switch unit B a communication code designating a particular one of the switches.

The high frequency transmitter signal from the transmitter interface 111 of the control unit A is detected and decoded by the data decoder 301 and is converted into a low frequency signal for the CPU 302. Input data from the data decoder 301 is compared with a default in the CPU 302. After recognition, the CPU 302 gives an output voltage to the two input terminals 504 and 505 (shown in FIG. 2) of the corresponding solid state relay 304. This causes an input indicator lamp 501 to be turned on. If the two terminals 506 and 508 of a load receive electric power from the two output terminals 506 and 507 of the solid state relay 304 and the two AC power supply terminals 507 and 508, the load is electrically connected, and therefore, the output indicator lamp 502 is turned on. If the input data from the data decoder 301 is not in conformity with the default, the CPU 302 gives no output voltage, and therefore, the relays 304 are at an "OFF" status. The power source 300 provides the the data decoder 301, the CPU 302 and the EEPROM 303 with the necessary working voltage. The EEPROM 303 is provided for storing the default, namely, the predetermined transmit code, function code and switch code.

Referring to FIG. 1 again, the default of the predetermined transmit code, function code and switch code is stored in the EEPROM 303 and controlled by the software program designated at the "S" key of the keyboard 106. The software program which compares an input signal with the default, is stored in the read only memory inside the CPU 302. The switch unit B of the present invention can be fastened to industrial control equipment and controlled by the control unit A through a telephone, a radio telephone or a computer data network. The operation of the present invention is outlined hereinafter. The "S" key of the keyboard 106 is pressed for system set up. When the system is set up, it provides three functions. The first function of the system setup program is to get the control unit A ready to start On or Off operations. Pressing the "S" key of the keyboard 106 causes the keyboard 106 to send a signal to the key board decoder 105. After decoding by the key board decoder 105, the signal from the keyboard 106 is sent through the first line driver/line receiver 107 to the CPU 101 for processing, causing the CPU 101 to provide a signal to the ROM 103 via the address latch 102. Upon receipt of the signal, the ROM 103 triggers the character pattern interface 104 to display a cross bar directing input of a password. The number of elements in the cross bar is not limited. The option of password function may be designated at the "1" key or any of the other numeric keys. The second function of the system setup program is to set a telephone control code. When a user wishes to control the microcontroller through an external telephone, the user dials the subscriber's telephone number, the telephone control code, the function code, and the switch code. The telephone control code may be designated as the "2" key or any of the other numeric keys. The third function of the system setup program is counting time. A time count is simultaneously displayed through the character pattern interface 104. The option of the time counting function may be designated at the "2" key or any of the other numeric keys. However, the option key for the function of setting the telephone code shall not be used for the function of counting time. The "R" key of the keyboard 106 is designated as the function key. For executing an "ON" operation, the "*" key is pressed or a numeric key is set. For executing an "OFF" operation, the "#" key is pressed or another numeric key is set, and then the "Q" key is pressed. The "Q" key is equivalent to a RUN key. Before pressing the "Q" key, the character pattern interface 104 operates in the same manner as the operation controlled by the "S" key. When the "Q" key is pressed, the CPU 101 converts the data in its internal random-access memory into a series information code and sends the series information code to the data decoder 301 of the switch unit B through the transmitter interface 111. The series information code from the CPU 101 may be modulated into a high frequency signal for transmitting to the data decoder 301 through the electric line of the AC power source. The series information code from the CPU 101 may also be transmitted to the data decoder 301 by the transmitter interface 111 using a radio frequency transmission.

Figure 3:
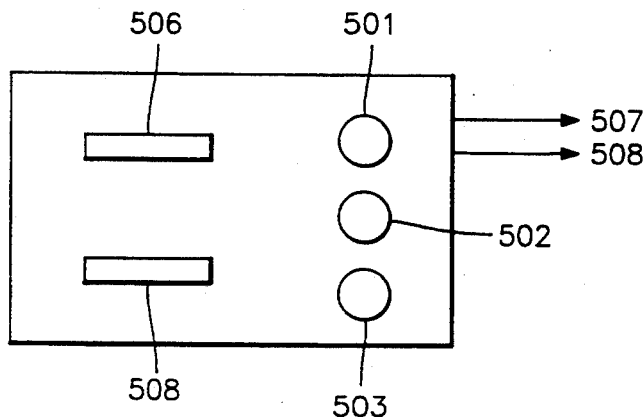
FIG. 3 is a plan view showing that the solid state relay has been made in the form of an integrated circuit.

Referring to the circuit diagram of the solid state relay 304 as shown in FIG. 2, there are provided a power indicator lamp 503, an output indicator lamp 502, and an input indicator lamp 501. The power indicator lamp 503 denotes the connection of electrical power to the switch unit B. The input indicator lamp 501 is for indicating and "ON" or "OFF" execution of the operation. The output indicator lamp 502 denotes the connection of electrical power to the load. When electrical current passes through the load, the output indicator lamp 502 is turned on. When there is no electrical current sent through the load, the output indicator lamp 502 is turned off. By means of the aforesaid arrangement, the operation of the switch unit B is completely indicated, and therefore, no digital display is required. FIG. 3, wherein illustrates the solid state relay as being made in the form an IC. Shown externally on the IC are the load terminals 508 and 506, the power input terminals 508 and 507, the input indicator lamp 501, the output indicator lamp 502 and the power indicator lamp 503.

Figure 4A:
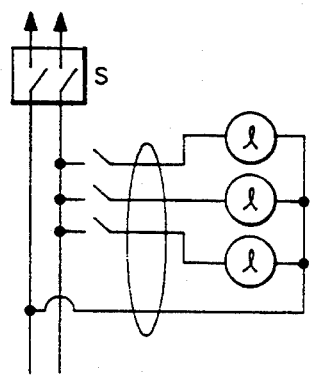
FIG. 4A is a circuit diagram of a system for power distribution according to the prior art.
Figure 4B:
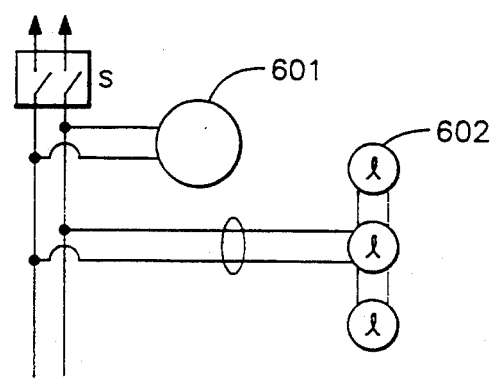
FIG. 4B is a circuit diagram of a system for power distribution according to the present invention.

Referring to a conventional technique illustrated in FIG. 4A, four electrical lines are required in order to control two lamps and one socket through two switches. Referring to the circuit diagram of FIG. 4B, for controlling two lamps and one socket through two switches according to the present invention, only two electric lines are required. As illustrated in FIG. 4B, the control unit 601 is connected to the electric lines at any suitable location, and the two lamps and the one socket include the switch unit 602. Therefore, the present invention makes wiring easy.

Referring to FIG. 2 again, the solid state relay 304 is a zero voltage closing relay. Besides the three indicator lamps, the solid state relay 304 adopts a photoelectric cell coupling method to effect electrical coupling of the socket. When the diode of the photoelectric cell coupler 509 is electrically driven, the photoelectric cell provides a voltage in response to light from the diode. The intensity of the voltage from the photoelectric cell may be determined according to the capacity of the photoelectric cell used. The voltage from the photoelectric cell is sent to a first silicon-controlled rectifier (first SCR) 510 between its gate and negative pole, thus causing the SCR 510 to be turned on. DC high voltage from the first SCR 510 is then sent to the gate of a second silicon-controlled rectifier (second SCR) 511 causing it to be electrically conductive. When the second SCR 511 is electrically conductive, the bridge rectifier 512 is electrically connected to turn on a TRIAC 513, and therefore, the two terminals 506 and 508 of the load are electrically connected to the power input. The resistors 514 and 515 and the transistor 511 constitute a zero voltage closing circuit for controlling the operation of the gate of the second SCR 511. If rectified impulse high voltage is higher than a specified voltage, the transistor 516 is turned on. Therefore, the rating voltage of the resistors 514 and 515 controls the operation of the transistor 516. When the transistor 516 is turned on, the gate of the second SCR 511 becomes short-circuited, and the corresponding solid state relay turns off. When the DC high voltage is below the specified voltage, the transistor 516 is off, the second SCR 511 is electrically conductive, and therefore, the corresponding solid state relay turns on.

Figure 5:
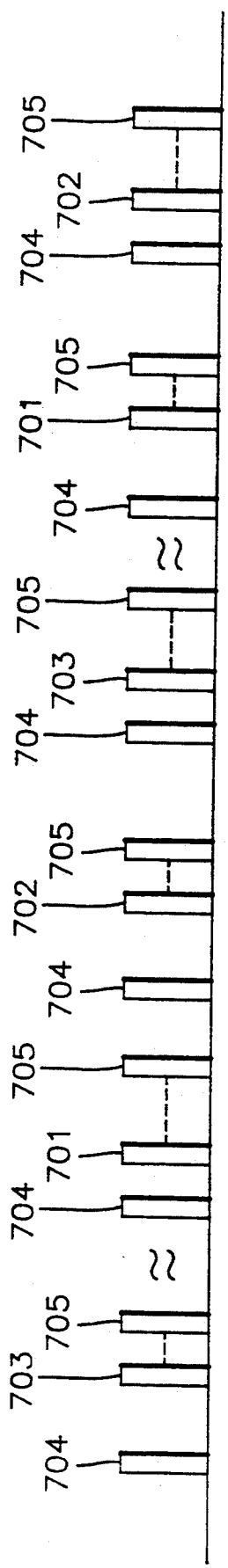
FIG. 5 is a structural chart of a data code according to the present invention.

Referring to FIG. 5, therein illustrated is a chart showing the structure of the data code according to the present invention. The transmit codes 701, the function codes 702 and the switch codes 703 are respectively formed of a pulse. Each unit pulse represents a bit. A start code 704 is set for each data code. A stop code 705 is provided when a data code is terminated. The start code 704 and stop code 705 are provided for recognizing the transmit codes 701, the function codes 702 and the switch codes 703 from one another.

Figure 6:
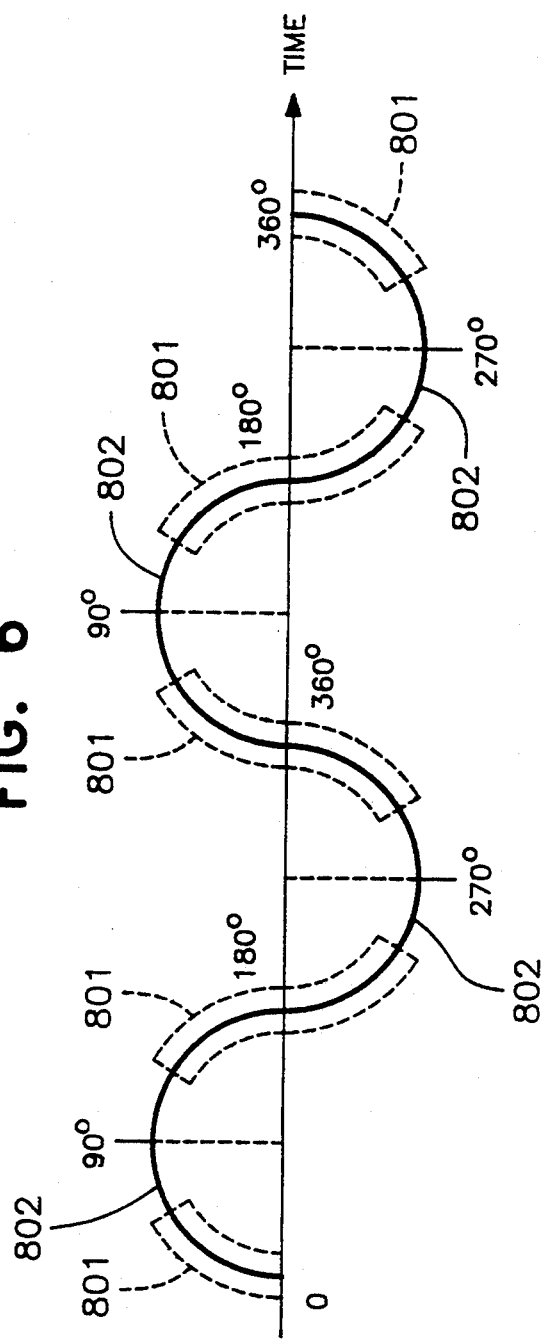
FIG. 6 is a chart showing the distribution of a high frequency carry and transfer data according to the present invention.

Referring to FIG. 6, the high frequency data code 801 is placed on the sinewave of the 60 HZ or 50 HZ AC power source 802. The high frequency data is transmitted twice within a 360° cycle of the power sources sinewave. In particular, 90° and 270° are the points of demarcation. In other words, the band width for the high frequency data code 801 is defined between the 90° point and the 270° point electric of the sinewave.

What is claimed is:

1. A microcontroller for remotely controlling a plurality of electrical switches, said microcontroller comprising a control unit and a switch unit, said control unit comprising:
- a central processing unit for outputting a transmit code for recognition by said switch unit, a function code indicative of a desired status of said switch unit between an ON status and an OFF status and also indicative of any desired function of said switch unit including a time counting function, and a switch code designating a particular one of said plurality of electrical switches;
- an address latch connected to said central processing unit;
- a read only memory connected to said central processing unit by way of the address latch, for storing said transmit code, function code and switch code, as well as programs which determine operation of the control unit, said read only memory be interfaced by the address latch to the central processing unit;
- a character pattern interface connected to said read only memory, for displaying the transmit code, the function code and the switch code;
- a keyboard for receiving manually inputted data;
- a keyboard decoder connected to keyboard and also connected to said central processing unit, for decoding said manually inputted data;
- a first line driver/line receiver connected to said keyboard decoder and said central processing unit, said first line driver/line receiver being responsive to decoded data from said keyboard decoder, for providing said decoded data to said central processing unit;
- a dual tone multifrequency unit for decoding data received from a telephone line;
- a second line driver/line receiver connected to said dual tone multifrequency unit and to said central processing unit, for providing said central processing unit with decoded data from said dual tone multifrequency unit;
- an electrically erasable programmable read only memory connected to said central processing unit, for storing registered data and preventing loss of said registered data during power failure; and
- a transmitter interface connected to said central processing unit, for receiving said transmit code, said function code and said switch code from the central processing unit, converting said transmit code, said function code and said switch code into high frequency data, and transmitting said high frequency data to said switch unit;

said switch unit comprising:
- a power supply;
- a data decoder in communication with and responsive to said transmitter interface of the control unit, for decoding said high frequency data and converting said high frequency data into a low frequency signal containing said transmit code, said function code and said switch code;
- a central processing device connected to said data decoder and responsive to said low frequency signal, said central processing device having a plurality of output ports and being programmed to compare said transmit code, said function code and said switch code respectively to default transmit codes, default function codes and default switch codes, said central processing device being further programmed to selectively provide output voltages to certain ones of said plurality of output ports pursuant to said comparison;
- data storage means connected to said central processing device of the switch unit, for storing said default transmit codes, said default function codes and said default switch codes; and
- a plurality of solid state relays connected to respective ones of said plurality of output ports and containing respective ones of said plurality of electrical switches, each of said plurality of solid state relays being responsive to said output voltages from the central processing device so as to close said respective ones of said plurality of electrical switches in response to the presence of said output voltages at said respective ones of said plurality of output ports;
- a power indicator lamp which is illuminated whenever the switch unit is connected to electrical power;
- an input indicator lamp connected to each of said plurality of solid state relays, for indicating by illumination the presence of said output voltages from the central processing device of the switch unit; and
- an output indicator lamp connected to each of said plurality of solid state relays, each output indicator lamp being illuminated whenever a respective one of the plurality of switches is closed and provides power to a load.

2. The microcontroller of claim 1, wherein said manually inputted data from said keyboard includes said transmit code, said function code, said switch code and an execution code sequentially arranged according to said programs in the read only memory of the control unit.

3. The microcontroller of claim 1, wherein said switch unit is programmed to perform an "ON" operation, when said power indicator lamp is illuminated, said "ON" operation being performed in response to said transmit code, an "ON" function code, said switch code and an execution code transmitted by said control unit in response to said manually inputted data from said keyboard of said control unit.

4. The microcontroller of claim 3, wherein said switch unit is programmed to perform an "OFF" operation, when said power indictor lamp is illuminated, said "OFF" operation being performed in response to said transmit code, an "OFF" function code, said switch code and an executive code transmitted by said control unit in response to said manually inputted data from said keyboard of said control unit, said "OFF" operation comprising elimination of the output voltages from said central processing device of the switch unit and deactivation of said input indicator lamp; and wherein said transmit code, said function code and said switch code are transmitted through said keyboard of said control unit to said switch unit in a predetermined sequence controlled by said programs in the read only memory of the control unit; said transmit code and said function code being incorporated into a special code and sent with said switch code to said switch unit via said control unit and said keyboard thereof.

5. The microcontroller of claim 4, wherein said transmit code, said function code and said switch code each begin with a start code and terminate with a stop code.

6. The microcontroller of claim 1, wherein said switch unit is programmed to perform an "OFF" operation, when said power indictor lamp is illuminated, said "OFF" operation being performed in response to said transmit code, an "OFF" function code, said switch code and an executive code transmitted by said control unit in response to said manually inputted data from said keyboard of said control unit, said "OFF" operation comprising elimination of the output voltages from said central processing device of the switch unit and deactivation of said input indicator lamp.

7. The microcontroller of claim 1, wherein said switch unit is programmed to execute a time setting operation, when said power indicator lamp is illuminated, said time setting operation being executed in response to said transmit code, a "time setting ON" function code, said switch code and an execution code transmitted by said control unit in response to said manually inputted data from said keyboard of said control unit.

8. The microcontroller of claim 7, wherein said switch unit is programmed to clear a time setting resulting from said time setting operation, when said power indicator lamp is illuminated, said time setting being cleared in response to said transmit code, a "time setting OFF" function code, said switch code and an execution code transmitted by said control unit in response to said manually inputted data from said keyboard of said control unit.

9. The microcontroller of claim 7, wherein said switch unit is programmed to execute a time setting operation, when said power indicator lamp is illuminated, said time setting operation being executed in response to said transmit code, a "time setting ON" function code, said switch code and an execution code transmitted by said control unit in response to said manually inputted data from said keyboard of said control unit; and wherein said "time setting ON" and "time setting OFF" function codes are repeatedly executable on a specific solid state relay of said switch unit.

10. The microcontroller of claim 1, wherein said control unit and said switch unit are interconnected by an AC power line carrying a sinusoidal AC signal, said control unit being programmed to transmit said high frequency data twice within a 360° cycle of the sinusoidal AC signal, each transmission of said high frequency data occurring between a 90° point and a 270° point of said 360° cycle.

* * * * *